(12) United States Patent
Kim et al.

(10) Patent No.: US 9,287,297 B2
(45) Date of Patent: Mar. 15, 2016

(54) THIN FILM TRANSISTOR ARRAY PANEL AND METHOD OF MANUFACTURING THE PANEL

(71) Applicant: SAMSUNG DISPLAY CO., LTD., Yongin, Gyeonggi-Do (KR)

(72) Inventors: Sho Yeon Kim, Hwaseong-Si (KR); Hyun Kim, Suwon-Si (KR); Eun Hye Park, Incheon (KR); Byung Hwan Chu, Hwaseong-Si (KR); Seung-Ha Choi, Suwon-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/486,620

(22) Filed: Sep. 15, 2014

(65) Prior Publication Data

US 2015/0200209 A1    Jul. 16, 2015

(30) Foreign Application Priority Data

Jan. 10, 2014  (KR) ........................ 10-2014-0003549

(51) Int. Cl.
*H01L 31/036* (2006.01)
*H01L 27/12* (2006.01)

(52) U.S. Cl.
CPC .......... *H01L 27/124* (2013.01); *H01L 27/1259* (2013.01)

(58) Field of Classification Search
CPC .................. H01L 2924/00; H01L 2924/0002; H01L 2924/12041; H01L 33/62; H01L 27/153; H01L 33/405; H01L 33/44; H01L 33/20; H01L 33/24; H01L 33/38; H01L 24/24; H01L 25/0753; H01L 27/323; H01L 33/08

See application file for complete search history.

(56) References Cited

U.S. PATENT DOCUMENTS

| 2010/0062606 | A1 | 3/2010 | Morikawa et al. |
| 2012/0286267 | A1 | 11/2012 | Suzawa et al. |
| 2013/0208205 | A1 | 8/2013 | Misaki |
| 2013/0215370 | A1 | 8/2013 | Takanishi et al. |

FOREIGN PATENT DOCUMENTS

| KR | 10-0719333 | 5/2007 |
| KR | 10-2009-0022804 | 3/2009 |
| KR | 10-2013-0069121 | 6/2013 |
| KR | 10-2013-0094554 | 8/2013 |

OTHER PUBLICATIONS

Xi Li, et al., "Effect of Ar and O2 Additives on SiO2 Etching in C4F8-Based Plasmas," pp. 284-293, J. Vac. Sci. Technol. 1 21(1), Jan./Feb. 2003.

*Primary Examiner* — Robert Bachner
(74) *Attorney, Agent, or Firm* — F. Chau & Associates, LLC

(57) ABSTRACT

A thin film transistor array panel includes: a gate line disposed on a substrate and including a first connection member of a gate driver region and a gate electrode of a display area, a gate insulating layer disposed on the substrate and having a first contact hole exposing the first connection member, a semiconductor layer disposed on a region of the gate insulating layer, a data line disposed on the gate insulating layer and the semiconductor layer and including a drain electrode, a source electrode, and a second connection member connected to the first connection member through the first contact hole, a passivation layer disposed on the data line, the source electrode, the drain electrode, and the second connection member, and a pixel electrode disposed on the passivation layer and electrically connected to the drain electrode. A horizontal width of the first contact hole ranges from 1 to 2 μm.

9 Claims, 9 Drawing Sheets

THIN FILM TRANSISTOR ARRAY PANEL AND METHOD OF MANUFACTURING THE PANEL

CROSS-REFERENCE TO RELATED APPLICATION

This application claims priority to Korean Patent Application No. 10-2014-0003549 filed on Jan. 10, 2014, the disclosure of which is hereby incorporated by reference herein in its entirety.

(a) TECHNICAL FIELD

The present disclosure relates to a thin film transistor array panel, and more particularly, to a thin film transistor array panel and a manufacturing method thereof, having a contact hole with a reduced area.

(b) DISCUSSION OF THE RELATED ART

Generally, a liquid crystal display includes a pair of display panels provided with field generating electrodes and polarizers, and a liquid crystal layer interposed between the two display panels. The field generating electrodes generate an electric field to the liquid crystal layer, and the arrangement of the liquid crystal molecules is changed according to the change of the intensity of the electric field. For example, the arrangement of the liquid crystal molecules of the liquid crystal layer is changed while applying the electric field such that the polarization of the light passing through the liquid crystal layer is changed. The polarizers appropriately block or transmit the polarized light to form bright and dark regions, thereby displaying images.

This liquid crystal display includes a display panel including pixels including switching elements and display signal lines, and a gate driver including a plurality of stages which sends gate signals to gate lines of the display signal lines to turn on or off the switching elements of the pixels.

Gate on/off voltages, clock signals, and the like are inputted into the stages of the gate driver and are supplied to a signal line connected to one side of each stage.

Meanwhile, as the area of a display increases, signal lines are also lengthened, and accordingly, resistance increases. If the resistance increases, difficulties such as, for example, signal delay or voltage drop may occur. To prevent the above-mentioned difficulties, it may be necessary to form signal lines of a material having low specific resistance.

In the meanwhile, an aluminum alloy is a material having low resistivity, and may be used together with a metal to form a multi-layered signal line.

In general, a contact hole for exposing a gate line may be formed to connect the gate line to a data line, and a connecting member made of indium tin oxide (ITO) may be used to connect the gate line and the data line to each other through the connecting member.

SUMMARY

Exemplary embodiments of the present invention have been made in an effort to provide a thin film transistor array panel and a manufacturing method thereof having benefits of being capable of reducing an area of a contact hole in a gate driver formed together with pixels.

An exemplary embodiment of the present invention provides a thin film transistor array panel including: a substrate, a gate line disposed on the substrate and including a first connection member of a gate driver region and a gate electrode of a display area, a gate insulating layer disposed on the substrate and having a first contact hole exposing the first connection member, a semiconductor layer disposed on a region of the gate insulating layer, a data line disposed on the gate insulating layer and the semiconductor layer and including a drain electrode, a source electrode, and a second connection member connected to the first connection member through the first contact hole, a passivation layer disposed on the data line, the source electrode, the drain electrode, and the second connection member, and a pixel electrode disposed on the passivation layer and electrically connected to the drain electrode. A horizontal width of the first contact hole is in a range of 1 to 2 μm.

The thin film transistor array panel may further include a common electrode configured to be insulated from the pixel electrode.

The semiconductor layer may include an oxide semiconductor, and a driver semiconductor layer may be disposed between the second connection member and an upper portion of the gate insulating layer corresponding to a portion of the first connection member.

The data line, the source electrode, the drain electrode, and the second connection member may include the same material as each other.

The first contact hole through which the second connection member may be exposed is disposed in the passivation layer, and the thin film transistor array panel may further include a contact assistant made of the same material as that of the pixel electrode and connected to the second connection member through the first contact hole.

A sidewall of the first contact hole may be linearly disposed in the driver semiconductor and the gate insulating layer, and an angle disposed between the sidewall of the first contact hole and the substrate may be in a range of 75 to 90°.

A second contact hole is disposed in the passivation through which the drain electrode may be exposed, and the pixel electrode may be electrically connected to the drain electrode through the second contact hole.

The gate insulating layer may have a double-layered structure including a lower layer including a silicon nitride and an upper layer including a silicon oxide.

The gate line and the first connection member may include at least one material selected from aluminum (Al), silver (Ag), copper (Cu), molybdenum (Mo), chromium (Cr), tantalum (Ta), and titanium (Ti).

The gate insulating layer may be a single layer including one material of a silicon nitride or a silicon oxide.

Each of the gate electrode and the first connection member may include a lower layer made of at least one material selected from the group consisting of aluminum (Al), silver (Ag), copper (Cu), molybdenum (Mo), chromium (Cr), tantalum (Ta), and titanium (Ti), and an upper capping layer on the lower layer. The upper capping layer includes a conductive layer.

An embodiment of the present invention provides a manufacturing method of a thin film transistor array panel. The method includes: forming a gate line on a substrate, with the gate line including a first connection member at a gate driver region and a gate electrode at a display area, forming a gate insulating layer on the substrate, the gate line, and the first connection member, forming a semiconductor layer on the gate insulating layer, forming a first contact hole by etching the semiconductor layer and the gate insulating layer by using a photosensitive film pattern to expose the first connection member, forming a data line on the gate insulating layer and the semiconductor layer, with the data line including a drain electrode, a source electrode, and a second connection member connected to the first connection member exposed through the first contact hole, forming a passivation layer on the data line, the source electrode, the drain electrode, and the second connection member, and forming a pixel electrode on the passivation layer. The pixel electrode is electrically connected to the drain electrode, and the forming of the first contact hole is performed by using dry etching.

The manufacturing method may further include forming a common electrode on the passivation layer, the common electrode being insulated from the pixel electrode.

The dry etching used for forming the first contact hole may include first etching for etching the semiconductor layer, and second etching for etching the gate insulating layer.

The first etching may be performed by using a chloride-based gas or bromine-based gas, and the second etching may be performed by using a fluorine-based gas or fluorocarbon-based gas.

A fluorocarbon-based polymer layer may be formed on a sidewall of the first contact hole in the second etching, and the manufacturing method may further include removing the polymer layer and the photosensitive film pattern by ashing.

The sidewall of the first contact hole may be linearly formed in the driver semiconductor and the gate insulating layer such that an angle formed between the sidewall of the first contact hole and the substrate is in a range of 75 to 90°.

The gas used in the second etching may further include argon (Ar) or hydrogen ($H_2$).

In accordance with an exemplary embodiment of the present invention, a thin film transistor array panel is provided. The thin film transistor array panel includes a substrate, a gate line disposed on the substrate and including a first connection member of a gate driver region and a gate electrode of a display area, a gate insulating layer disposed on the substrate and having a first contact hole exposing the first connection member, a semiconductor layer disposed on a region of the gate insulating layer, a data line disposed on the gate insulating layer and the semiconductor layer and including a drain electrode, a source electrode, and a second connection member connected to the first connection member through the first contact hole, a first passivation layer disposed on exposed portions of the data line, the source electrode, the drain electrode, the gate insulating layer, the semiconductor layer and the second connection member, an organic second passivation layer disposed on the first passivation layer and in which the organic second passivation layer does not overlap with either of the first connection member or the second connection member, a common electrode disposed on the organic second passivation layer, a third passivation layer disposed on the common electrode, and a pixel electrode disposed on the third passivation layer. The pixel electrode is physically and electrically connected to the drain electrode through a second contact hole in the first passivation layer, the second passivation layer and the third passivation layer.

In addition, the thin film transistor array panel further includes a contact assistant disposed on the third passivation layer and the second connection member.

A horizontal width of the first contact hole is in a range of 1 to 2 μm.

In the thin film transistor array panel in accordance with exemplary embodiments of the present exemplary embodiment, it is possible to reduce the area of a contact hole of a gate driver by dividing the etching process of the contact hole of the gate driver into two processes and respectively performing the two processes by using different types of gases, thereby decreasing the area of the gate driver and the bezel area of a display device.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Figure 1:
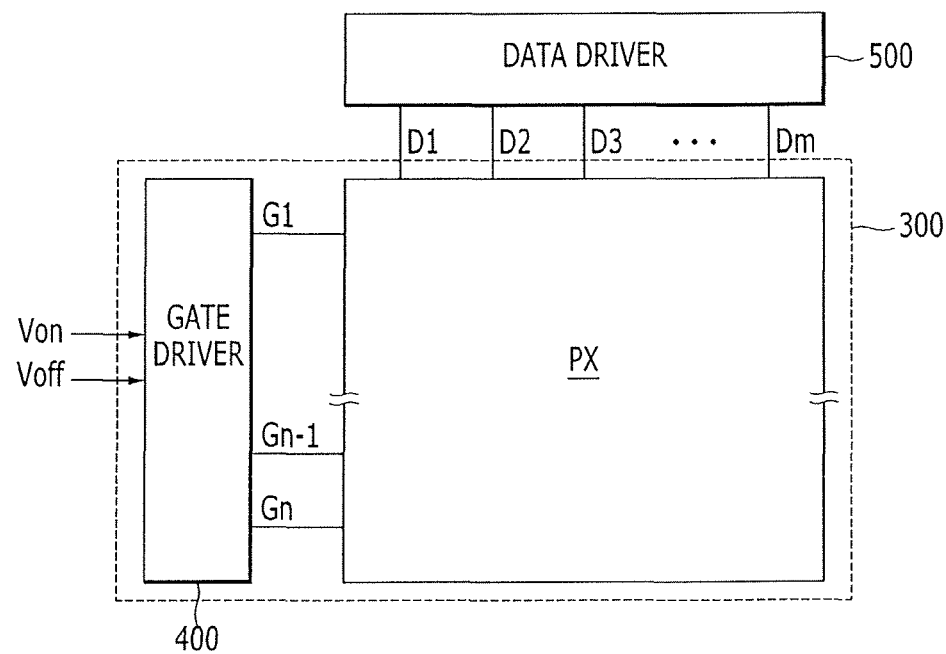
FIG. 1 is a block diagram showing a display device in accordance with an exemplary embodiment of the present invention.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

A thin film transistor array panel in accordance with an exemplary embodiment of the present invention will now be described with reference to the accompanying drawings.

First, a display device in accordance with the present exemplary embodiment will be described with reference to FIG. 1.

FIG. 1 is a block diagram showing the display device in accordance with an exemplary embodiment of the present invention.

As shown in FIG. 1, the display device in accordance with the present exemplary embodiment includes, for example, a the display panel 300 including a pixel unit PX and a gate driver 400 connected to the pixel unit PX, and a data driver 500 connected to the pixel unit PX. The display device further includes, for example, a gray voltage generator connected to the data driver 500, and a signal controller for controlling the gate driver 400, the data driver 500, and the gray voltage generator.

The gate driver 400 included in the display device in accordance with the present exemplary embodiment may be formed together with the display panel 300 in a forming process of the display panel 300, and may be integrally formed with the display panel 300 at one side of the display panel 300 in the display device to be covered by a black matrix.

The pixel unit PX includes, for example, a plurality of signal lines G1-Gn and D1-Dm and a plurality of pixels connected thereto.

The signal lines G1-Gn and D1-Dm includes, for example, a plurality of gate lines G1-Gn for transferring gate signals (or referred to as scanning signals) and a plurality of data lines D1-Dm for transferring data signals. The gate lines G1 to Gn extend, for example, substantially in a row direction so as to be parallel to each other, and the data lines D1 to Dm extend, for example, substantially in a column direction so as to be parallel to each other.

Hereinafter, the thin film transistor array panel in accordance with the present exemplary embodiment will be described with reference to FIG. 2 to FIG. 3.

Figure 2:
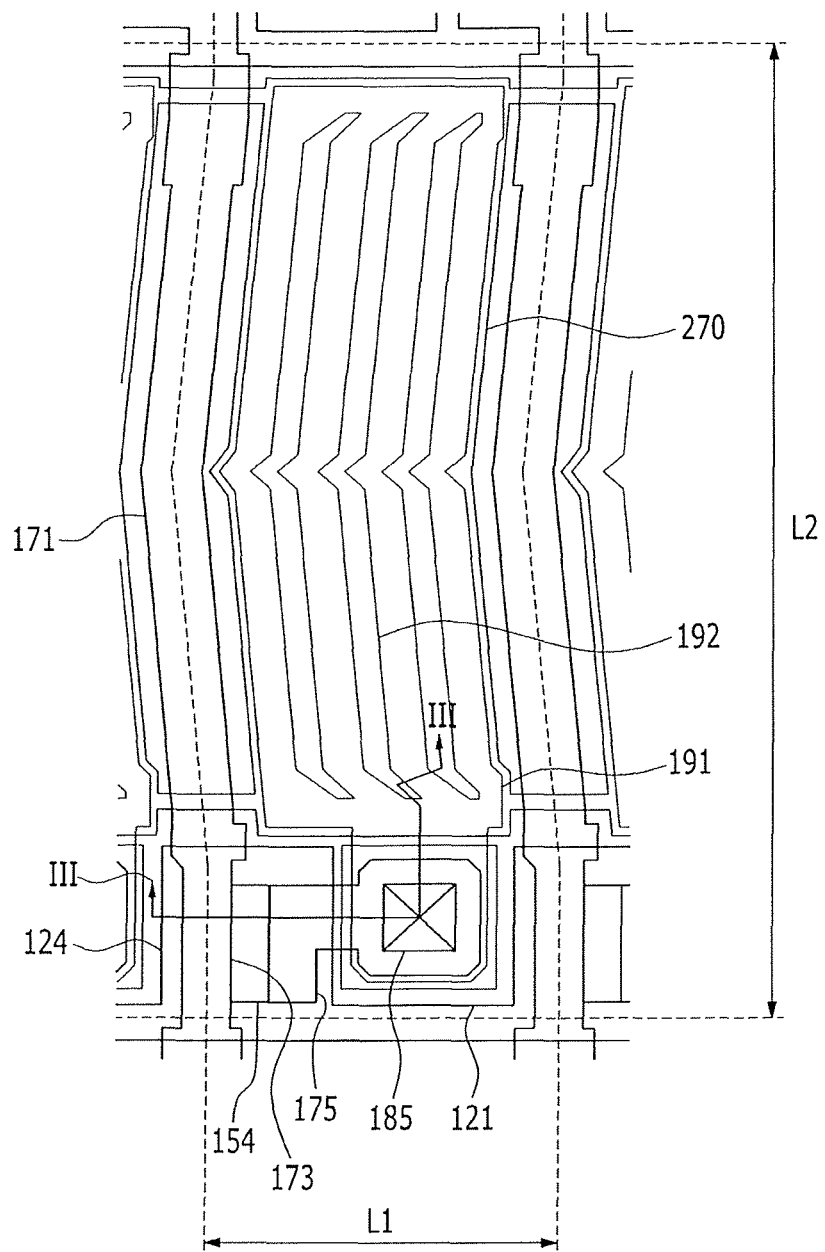
FIG. 2 is a layout view partially showing a pixel area of the display device in accordance with an exemplary embodiment.
Figure 3:
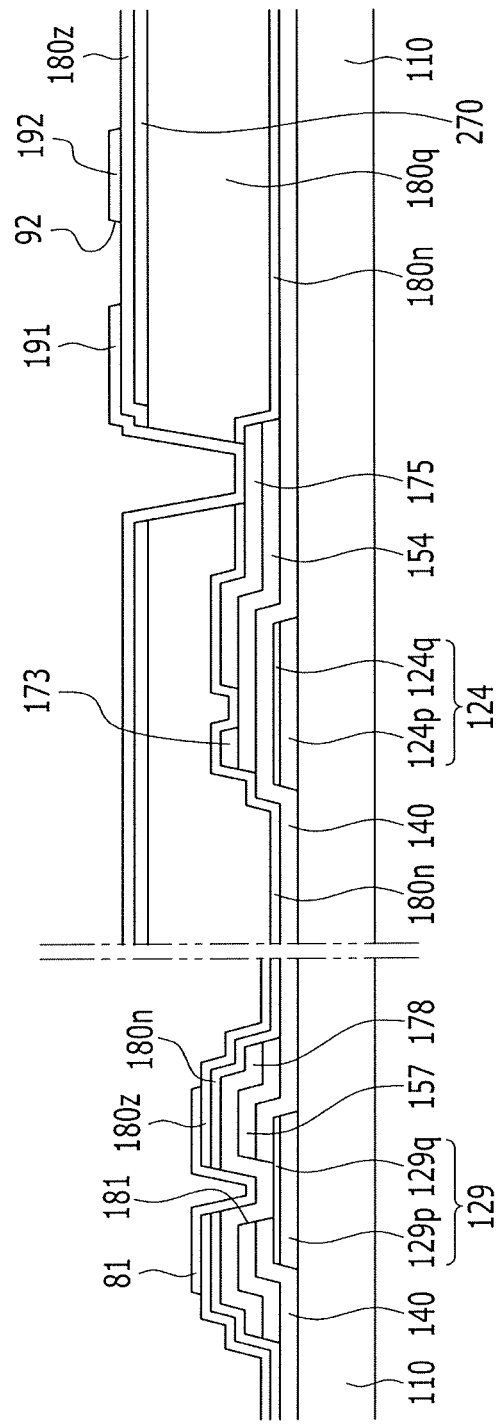
FIG. 3 shows a cross-sectional view of a contact hole of the display device in accordance with an exemplary embodiment and a cross-sectional view taken along a line IV-IV in the layout view shown in FIG. 2.

FIG. 2 is a layout view partially showing a pixel area of the display device in accordance with the present exemplary embodiment, and FIG. 3 shows a cross-sectional view of a contact hole of the display device in accordance with the present exemplary embodiment and a cross-sectional view taken along a line IV-IV in the layout view shown in FIG. 2.

First, a pixel area PX and the gate driver 400 formed together with the pixel area PX will be described in detail.

In FIG. 2 and FIG. 3, one pixel area is taken as an example, but the display device in accordance with the present exemplary embodiment may have a resolution of, for example, about 200 pixels per inch (PPI) or more. That is, about 200 pixels or more may be included at a region of 1 inch×1 inch of the liquid crystal display. Further, a horizontal length L1 of one pixel in the liquid crystal display in accordance with the present exemplary embodiment may be, for example, equal to or smaller than about 40 μm, and a vertical length L2 thereof may be, for example, equal to or smaller than about 120 μm. Herein, as shown FIG. 2, the horizontal length L1 of one pixel indicates a distance of between two adjacent data lines 171 by which a vertical central region is defined, and the vertical length L2 thereof indicates a distance between two adjacent gate lines 121 by which a horizontal central region is defined.

The gate driver 400 has, for example, a circuit portion including a plurality of transistors including a first connection member 129 and a second connection member 178.

In the thin film transistor array panel of the display device in accordance with the present exemplary embodiment, a gate line 121 including a gate electrode 124 located in the display panel 300 and a gate conductor including the first connection member 129 located in the gate driver 400 are formed on an insulating substrate 110 formed of transparent glass, plastics, quartz or the like.

Also, in an exemplary embodiment, the insulating substrate 110, may be formed of, for example, ceramic or silicon materials. Further, in an exemplary embodiment, the insulating substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate line 121 located in the display panel 300 may be extended to be connected to the first connection member 129.

The gate conductor may be made of, for example, an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti), and the like. The gate electrode 124 and the first connection member 129 may have, for example, a double layered structure including lower layers 124p and 129p and upper capping layers 124q and 129q disposed on the lower layers 124p and 129p, respectively. The lower layers 124p and 129p may include, for example, at least one material selected from the group consisting of aluminum (Al), silver (Ag), copper (Cu), molybdenum (Mo), chromium (Cr), tantalum (Ta), and titanium (Ti), and the like. The upper capping layers 124q and 129q may be formed of conductive layers having different physical properties.

A gate insulating layer 140 made of, for example, an insulating material such as a silicon oxide (SiOx), a silicon nitride (SiNx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate ($BaTiO3$), lead titanate ($PbTiO_3$), or a combination thereof is formed on the gate conductor. The gate insulating layer 140 may have, for example, a multi-layered structure including at least two insulating layer having different physical properties.

A semiconductor 154 and a driver semiconductor 157 are formed on the gate insulating layer 140. Each of the semiconductor 154 and the driver semiconductor 157 may include, for example, an oxide semiconductor. For example, the oxide semiconductor can be made of an oxide material including indium, zinc, tin, gallium, lead, germanium, cadmium, or an oxide compound thereof, such as indium gallium zinc oxide, indium zinc oxide and zinc tin oxide, but exemplary embodiments are not limited thereto.

A data conductor is formed on the semiconductor 154 and the gate insulating layer 140, the data conductor including the data line 171 including the source electrode 173 and the drain electrode 175 located in the display panel 300, and the second connection member 178 located in the gate driver 400.

A first contact hole 181 is formed on a portion of the first connection member 129 on which the gate insulating layer 140 and the driver semiconductor 157 are removed, a second connection member 178 that is made of the same material as that of the data line 171 is formed on the first connection member 129 exposed through the first contact hole 181, and the second connection member 178 and the first connection member 129 are physically and electrically connected to each other.

A horizontal width of a sidewall of the first contact hole 181 may be in a range of, for example, 1 to 2 μm, the sidewall of the first contact hole 181 may be linearly formed in the driver semiconductor 157 and the gate insulating layer 140, and the angle formed between the sidewall of the first contact hole 181 and the insulation substrate 110 may be, for example, in a range of 75 to 90°.

The data line 171 includes a wide end portion for connection with another layer or an external driving circuit. The data line 171 transfers a data signal and extends mainly in a vertical direction to cross the gate line 121.

In this case, the data line 171 may have, for example, a first bent portion having a bent shape to obtain maximum transmittance of the liquid crystal display, and bent portions may meet each other in a middle region of a pixel region to form a V shape. In addition, a second bent portion that is, for example, bent so as to have a predetermined angle with the first bent portion may be further included in the middle region of the pixel region.

For example, the first bent portion of the data line 171 may be bent so as to have, for example, an angle of about 7° with respect to a vertical reference line y (a reference line extending in a y direction) having an angle of 90° with respect to a direction (x direction) in which the gate line 121 extends. The second bent portion disposed in the middle region of the pixel region may be, for example, further bent so as to have an angle of about 7° to about 15° with respect to the first bent portion.

The source electrode 173 is a part of the data line 171 and is disposed on the same line as that of the data line 171. The drain electrode 175 is formed so as to extend, for example, parallel to the source electrode 173. Accordingly, the drain electrode 175 is, for example, parallel to the part of the data lines 171.

The gate electrode 124, the source electrode 173, and the drain electrode 175 form a thin film transistor (TFT) together with the semiconductor 154, and a channel of the thin film transistor is formed in the semiconductor 154 between the source electrode 173 and the drain electrode 175.

The liquid crystal display in accordance with the present exemplary embodiment includes, for example, the source electrode 173 positioned on the same line as that of the data line 171, and the drain electrode 175 extending in parallel to the data line 171 to increase a width of the thin film transistor without increasing an area occupied by the data conductor, thus increasing an aperture ratio of a liquid crystal display.

The data line 171, the drain electrode 175, and the second connection member 178 may be made of, for example, a refractory metal such as molybdenum, chromium, tantalum, and titanium, or an alloy thereof, and may have, for example, a multilayered structure including a refractory metal layer and a low resistance conductive layer.

An example of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data line 171 and the drain electrode 175 may be made of various metals or conductors in addition to the aforementioned structures. A width of the data line 171 may be, for example, about 3.5 μm±0.75 μm.

A first passivation layer 180n is disposed on exposed portions of the data conductors 171, 173, and 175, the gate insulating layer 140, and the semiconductor 154. The first passivation layer 180n may be formed of, for example, an organic insulating material, an inorganic insulating material, or the like.

An organic second passivation layer 180q is disposed on the first passivation layer 180n. The organic second passivation layer 180q may be omitted. The second passivation layer 180q may be, for example, a color filter. When the organic second passivation layer 180q is the color filter, it may uniquely display one of primary colors, and an example of the primary colors is three primary colors such as red, green, and blue, or yellow, cyan, and magenta. In addition, the color filter may further include a color filter displaying a combination color of the primary colors, or white, other than the primary colors.

A common electrode 270 is formed on the organic second passivation layer 180q. For example, the common electrode 270 with a planar shape may be formed on the entire surface of the insulation substrate 110 in a whole plate shape, and may have an opening disposed in a region corresponding to a periphery of the drain electrode 175. That is, the common electrode 270 may have, for example, a plate-like plane shape. The common electrode 270 may be made of, for example, a transparent conductive material such as indium tin oxide (ITO), indium zinc oxide (IZO), aluminum zinc oxide (AZO), cadmium tin oxide (CTO), or a combination thereof.

The common electrodes 270 positioned at the adjacent pixels are connected to each other to receive a common voltage having a predetermined magnitude supplied from the outside of a display area.

A third passivation layer 180z is disposed on the common electrode 270. The third passivation layer 180z may be made of, for example, an organic insulating material, an inorganic insulating material, or the like.

Herein, the organic second passivation layer 180q may be omitted, and the first passivation layer 180n and the third passivation layer 180z may be formed at a portion connected to the first connection member 129 formed at the gate driver 400.

Further, the same first contact hole 181 may be formed at a portion corresponding to the first contact hole 181 in the first passivation layer 180n and the third passivation layer 180z at a portion corresponding to the first connection member 129, which is formed in the gate driver 400.

A pixel electrode 191 is formed on the third passivation layer 180z. The pixel electrode 191 includes, for example, a curved edge that is almost parallel to the first bent portion and the second bent portion of the data line 171. The pixel electrode 191 may be made of, for example, a transparent conductive material such as indium tin oxide (ITO), indium zinc oxide (IZO), aluminum zinc oxide (AZO), cadmium tin oxide (CTO), or a combination thereof. The pixel electrode 191 has, for example, a plurality of first cutouts 92, and includes a plurality of first slit electrodes 192 defined by the plurality of first cutouts 92.

A second contact hole 185 exposing the drain electrode 175 is formed in the first passivation layer 180n, the organic second passivation layer 180q, and the third passivation layer 180z. The pixel electrode 191 is physically and electrically connected to the drain electrode 175 through the second contact hole 185 to receive a voltage from the drain electrode 175.

Further, the first contact hole 181 for exposing the first connection member 129 of the gate driver 400 is completely covered by the second connection member 178, and a contact assistant 81 is formed together with the pixel electrode 191 on the second connection member 178 and the third passivation layer 180z. In this case, the contact assistant 81 is made of a material such as, for example, indium tin oxide (ITO) or indium zinc oxide (IZO).

Also, an alignment layer is coated on the pixel electrode 191 and the third passivation layer 180z, and the alignment layer may be, for example, a horizontal alignment layer and be rubbed in a predetermined direction. However, alternatively, in an exemplary embodiment of the present invention, the alignment layer includes, for example, a photoreactive material to be photoaligned.

Hereinafter, a manufacturing method of the thin film transistor array panel shown in FIG. 2 and FIG. 3 will be described in detail with reference to FIG. 4 to FIG. 7.

FIG. 4 to FIG. 7 are stepwise cross-sectional views showing the manufacturing method of a thin film transistor array panel in accordance with an exemplary embodiment of the present invention.

Figure 4:
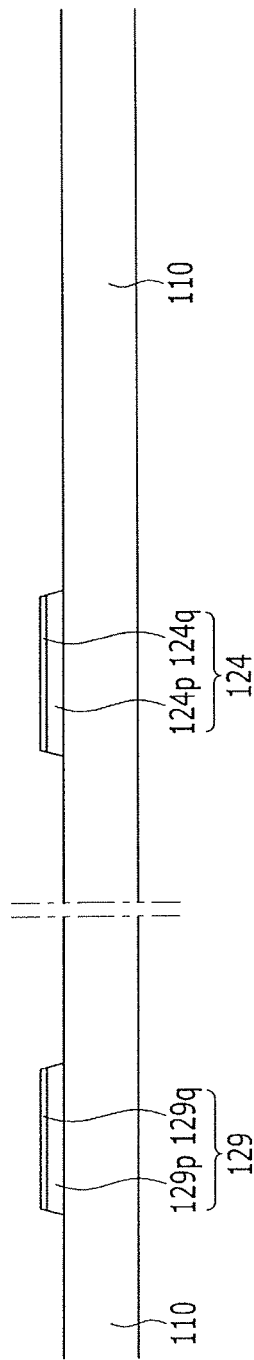
FIG. 4 to FIG. 7 are stepwise cross-sectional views showing a manufacturing method of the thin film transistor array panel in accordance with an exemplary embodiment.

First, referring to FIG. 4, on the insulation substrate 110, the gate line 121 and the gate driver 400 are formed in the display panel 300, and the gate conductors 121, 124, and 129 including the first connection member 129 is formed in the gate driver 400. The gate line 121 located in the display panel 300 may be extended to be connected to the first connection member 129.

The gate electrode 124 and the first connection member 129 may be formed to have, for example, a double layered structure including lower layers 124p and 129p and upper capping layers 124q and 129q disposed on the lower layers 124p and 129p, respectively. The lower layers 124p and 129p may include, for example, at least one material selected from the group consisting of aluminum (Al), silver (Ag), copper (Cu), molybdenum (Mo), chromium (Cr), tantalum (Ta), and titanium (Ti), and the like. The upper capping layers 124q and 129q may be formed of conductive layers having different physical properties.

This is to prevent lifting of the gate insulating layer 140 on upper portions of the gate wires 121 and 124 caused by a copper oxide (CuOx) when the gate conductors 121, 124, and 129 are made of copper and the gate insulating layer 140 is made of a silicon oxide (SiOx). Accordingly, when the gate insulating layer 140 includes a silicon nitride (SiNx) exclusively or a silicon nitride and other materials, the upper capping layers 124q and 129q may be omitted.

Figure 5:
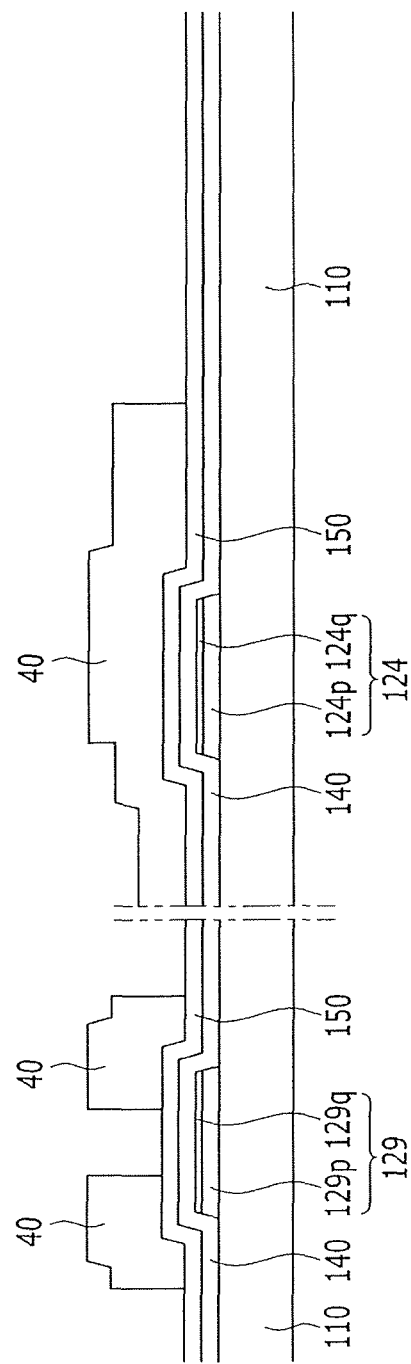

Next, referring to FIG. 5, the gate insulating layer 140 is stacked on the insulation substrate 110 on which the gate electrode 124 and the first connection member 129 have been formed, and the semiconductor layer 150 is formed on the gate insulating layer 140.

Next, a photosensitive film is stacked on the semiconductor layer 150 and is then exposed and developed to form photosensitive film pattern 40.

Figure 6:
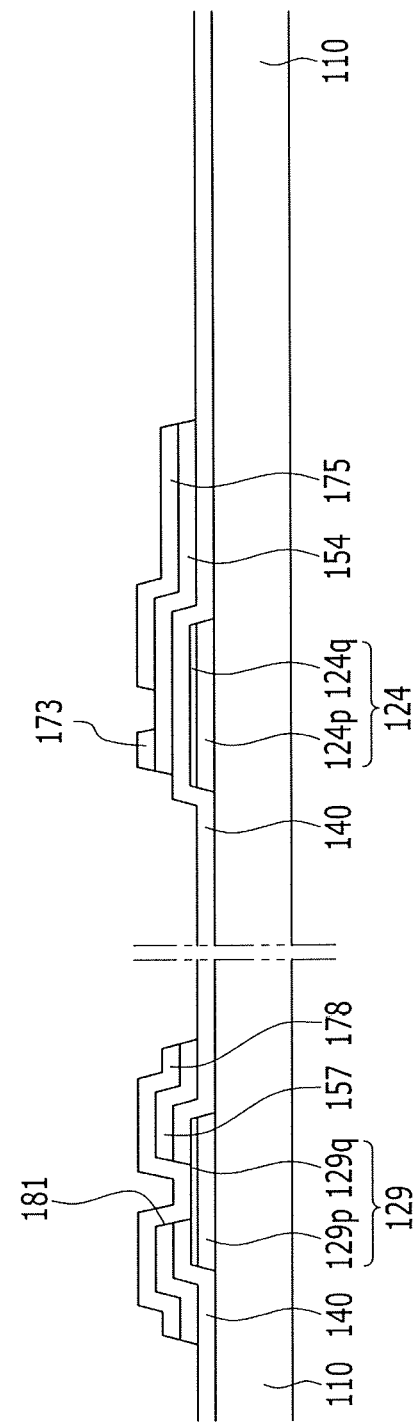

Referring to FIG. 6, a first dry etching process is performed by using the photosensitive film pattern 40 so as to remove the semiconductor layer 150, and then a second dry etching process is performed to remove the gate insulating layer 140 in a step for forming the first contact hole 181 at a portion at which the first connection member 129 has been formed.

Herein, the first dry etching process may be performed by using, for example, a chloride-based gas or bromine-based gas, and the second etching process may be performed by using, for example, a fluorine-based gas or fluorocarbon-based gas.

A horizontal width of a sidewall of the first contact hole 181 formed through the first and second dry etching processes may be in a range of, for example, 1 to 2 µm, the sidewall of the first contact hole 181 may be linearly formed in the driver semiconductor 157 and the gate insulating layer 140, and an angle formed between the sidewall of the first contact hole 181 and the insulation substrate 110 may be in a range of, for example, 75 to 90°.

In the first and second etching processes, the vertical etching degree or the thickness of the polymer layer may be adjusted by, for example, adding argon (Ar) or hydrogen ($H_2$) into the fluorine-based gas or fluorocarbon-based gas employed in the second dry etching process.

According to the first and second dry etching processes, the sidewall of the gate insulating layer 140 can be protected by, e.g., the fluorocarbon-based polymer layer formed on the sidewall of the first contact hole 181, and the gate insulating layer 140 is not limited without being affected by any etching gas. Accordingly, the gate insulating layer 140 can be made, for example, exclusively of a silicon nitride.

Thereafter, the polymer layer formed on the sidewall of the first contact hole 181 and the remaining photosensitive film pattern 40 is removed through, for example, ashing.

The source and drain electrodes 173 and 175 and the second connection member 178 made of, for example, the same material as that of the data line 171 are formed on the remaining driver semiconductor 157 which is not etched thanks to the photosensitive film pattern 40 in the first connection member 129 and its peripheral area which are exposed through the first contact hole 181 formed in the gate driver 400.

Figure 7:
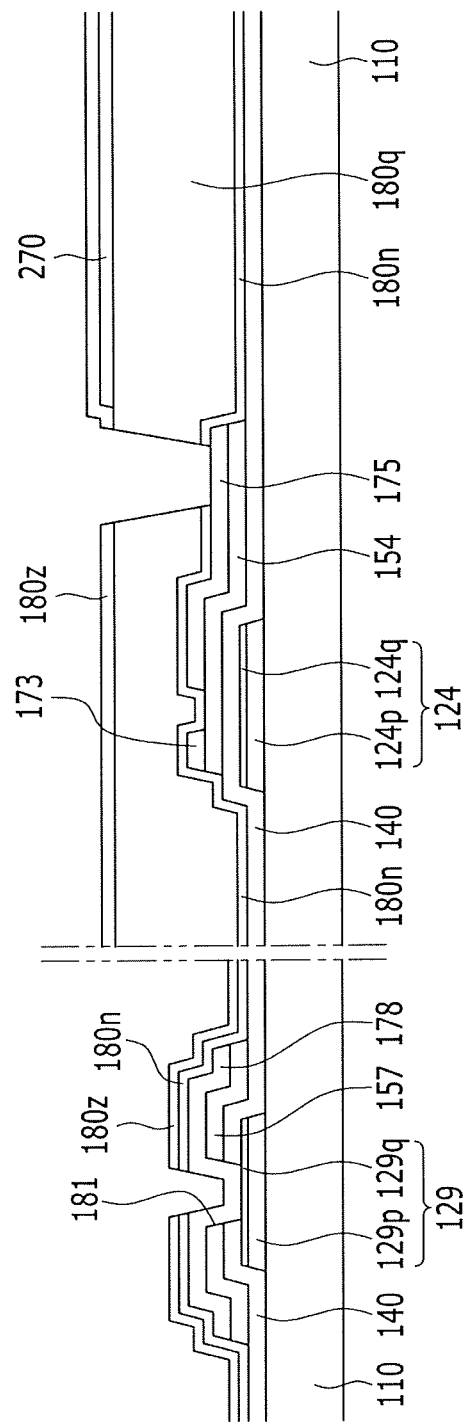

Referring to FIG. 7, the source and drain electrodes 173 and 175 and the second connection member 178 are made by, for example, using the same material as that of the data line 171, and then the first passivation layer 180n, the organic second passivation layer 180q, and the third passivation layer 180z are sequentially stacked. In the pixel unit PX, the common electrode 270 is formed on the second passivation layer 180q before the third passivation layer 180z is stacked.

Herein, the first passivation layer 180n and the third passivation layer 180z may be formed at a portion corresponding to the first connection member 129 formed in the gate driver 400.

Further, the same first contact hole 181 may be formed at portions corresponding to the first contact hole 181 in the first passivation layer 180n and the third passivation layer 180z to correspond to the first connection member 129 formed in the gate driver 400.

Finally, the pixel electrode 191 is formed on the second contact hole 185 and the third passivation layer 180q through which the drain electrode 175 is partially exposed.

Then, the contact assistant 81 is formed on the second connection member 178 of the gate driver 400 by using, for example, the same material as that of the pixel electrode 191, thereby completely manufacturing the thin film transistor array panel shown in FIG. 3 in accordance with the present exemplary embodiment.

Figure 8:
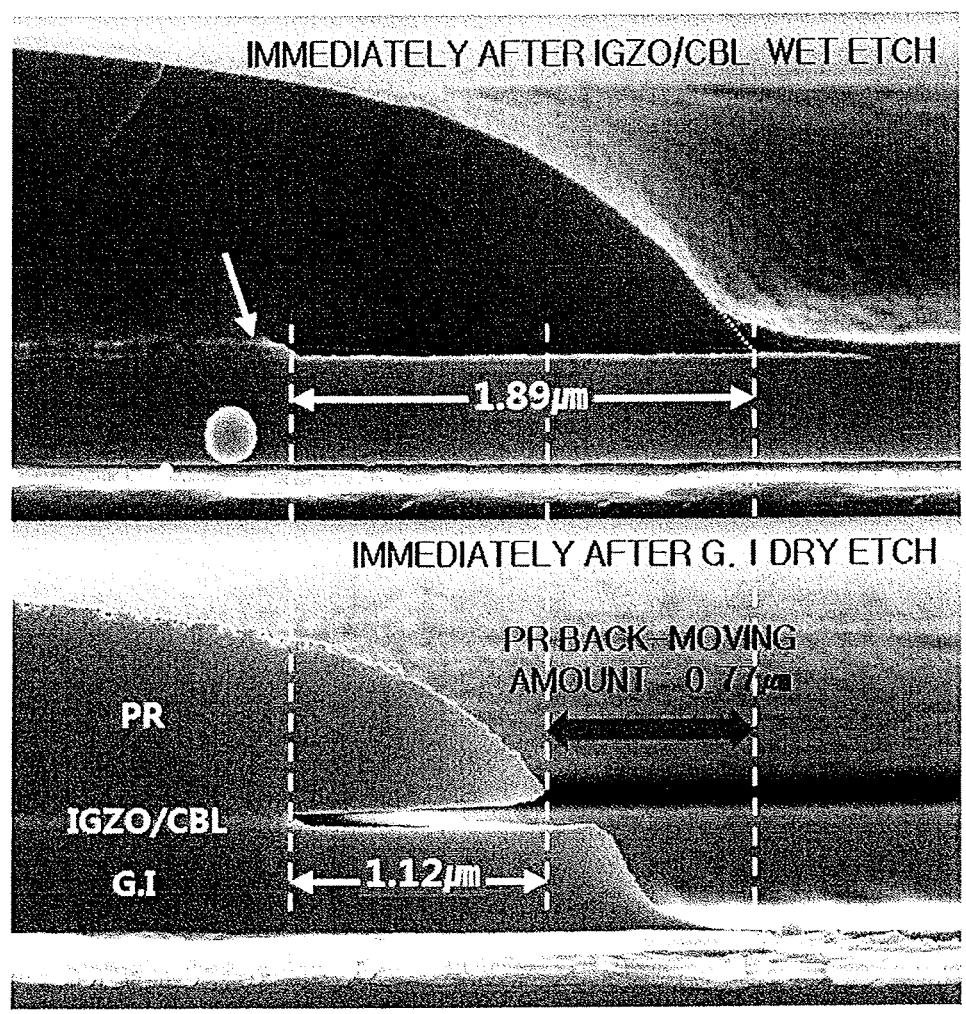
FIG. 8 is a photograph showing a contact hole after an etching process in accordance with a conventional manufacturing method of a thin film transistor array panel.

FIG. 8 is a photograph showing an etching step of the first contact hole 181 according to an etching process that is typically performed. In the etching process of the first contact hole 181 that is typically performed, after the photosensitive film pattern 40 is formed, a first etching process such as, for example, wet etching is performed on the semiconductor layer 150, and then a second etching process such as, for example, dry etching is performed on the gate insulating layer 140 by using, for example, a nitrogen fluoride-based gas or oxygen-based gas.

In this case, in the second etching process, the selectivity of a silicon nitride (SiNx) and a silicon oxide (SiOx) included in the gate insulating layer 140 is high. Accordingly, to control an etching degree, the etching process is performed while the photosensitive film pattern 40 is moved back toward the outside of the first contact hole 181.

As described above, as the etching process is performed while the photosensitive film pattern 40 is moved back toward the outside of the first contact hole 181 in the second etching process, the etching should be performed more internally than an edge of the photosensitive film pattern 40 and a position of the gate insulating layer 140 to form the first contact hole 181 in consideration of the moving-back degree of the photosensitive film pattern 40 in the driver semiconductor 157 located below the photosensitive film pattern 40.

In other words, after the first contact hole 181 is finally formed in the driver semiconductor 157 formed by the first wet etching process, a lower portion of the photosensitive film pattern 40 should be sufficiently undercut. Accordingly, the gate insulating layer 140 and the driver semiconductor 157 are formed in a step shape as shown in FIG. 8 after the first etching process.

Next, the etching of the gate insulating layer 140 is performed as the second etching process. Accordingly, the sidewall of the first contact hole 181 formed after the photosensitive film pattern 40 is finally removed cannot be linearly formed as the driver semiconductor 157 and the gate insulating layer 140 are formed in the step shape. The area of the first contact hole 181 formed as described above can be increased by the step shape of the driver semiconductor 157 and the gate insulating layer 140.

In contrast, in the case of the second wet etching process in accordance with the present exemplary embodiment, the chloride-based gas or bromine-based gas used in the first dry etching process increases the selectivity between the photosensitive film and the semiconductor layer. In the case of using the fluorine-based gas or fluorocarbon-based gas in the etching process, a fluorocarbon-based polymer layer is formed on the sidewall of the first contact hole 181 while a lower surface thereof is etched. Accordingly, the sidewall can be prevented from being etched while the lower surface thereof is etched.

Further, the polymer layer formed on the sidewall of the first contact hole 181 can serve as a passivation layer of the sidewall, and thus the first contact hole 181 can be formed without backward movement of the photosensitive film pattern 40. Accordingly, the first etching process for etching the driver semiconductor 157 may not require the backward movement of the photosensitive film pattern 40, and the etching can be performed to the same position as the edge of the photosensitive film pattern 40 and the position of the gate insulating layer 140 to form the first contact hole 181.

As a result, the sidewall of the first contact hole 181 can be formed in the driver semiconductor 157 and the gate insulating layer 140 in a linear shape instead of in the step shape, thereby preventing an increase in the horizontal area of the first contact hole 181.

As for the second try etching process in accordance with the present exemplary embodiment, gallium zinc oxide (GZO) and indium gallium zinc oxide (IGZO) were etched by using, for example, the chlorine-based gas to determine whether the dry etching can be performed on the semiconductor layer when the chlorine-based gas is used. This result is shown in FIG. 9.

Figure 9:
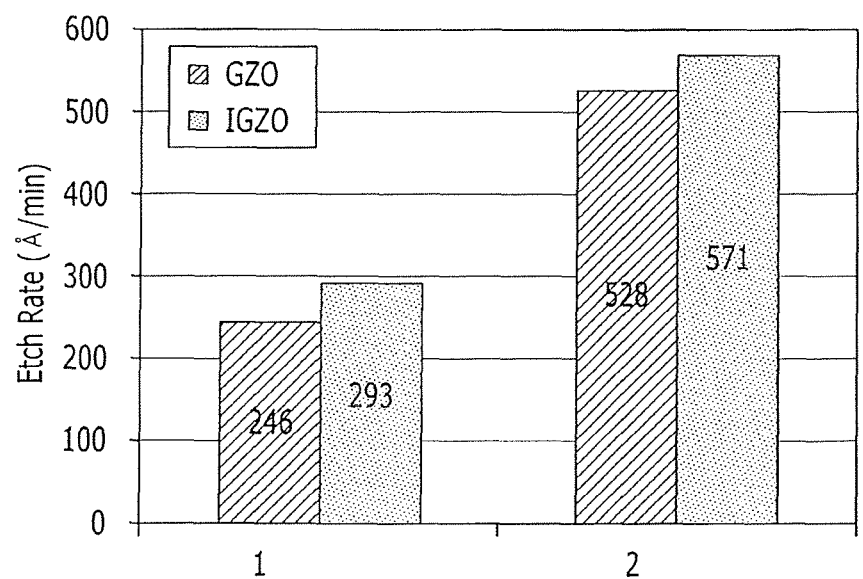
FIG. 9 is a graph of a test result showing whether to facilitate dry etching of a semiconductor layer in the case of using a chlorine-based gas.

In FIG. 9, the horizontal axis indicates a first test and a second test for GZO and IGZO, and the vertical axis indicates an etch rate, As shown in FIG. 9, it is determined that both GZO and IGZO can be dry-etched by using, for example, the chlorine gas and the conventional wet etching of the semiconductor layer can be replaced with the dry etching.

As described above, in the thin film transistor array panel in accordance with the present exemplary embodiment, it is possible to reduce the area of a contact hole of a gate driver by dividing the etching process of the contact hole of the gate driver into two processes and respectively performing the two processes by using different types of gases, thereby decreasing the area of the gate driver and the bezel area of a display device.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A manufacturing method of a thin film transistor array panel, the method comprising:
   forming a gate line on a substrate, the gate line including a first connection member at a gate driver region and a gate electrode at a display area;
   forming a gate insulating layer on the substrate, the gate line, and the first connection member;
   forming a semiconductor layer on the gate insulating layer;
   forming a first contact hole by etching the semiconductor layer and the gate insulating layer by using a photosensitive film pattern to expose the first connection member;
   forming a data line on the gate insulating layer and the semiconductor layer, the data line including a drain electrode, a source electrode, and a second connection member connected to the first connection member exposed through the first contact hole;
   forming a passivation layer on the data line, the source electrode, the drain electrode, and the second connection member; and
   forming a pixel electrode on the passivation layer, the pixel electrode being electrically connected to the drain electrode,
   wherein the forming of the first contact hole is performed by using dry etching.

2. The manufacturing method of claim 1, further comprising
   forming a common electrode on the passivation layer, the common electrode being insulated from the pixel electrode.

3. The manufacturing method of claim 2, wherein the dry etching used for forming the first contact hole includes a first etching for etching the semiconductor layer, and
   a second etching for etching the gate insulating layer.

4. The manufacturing method of claim 3, wherein the first etching is performed by using a chloride-based gas or bromine-based gas, and
   the second etching is performed by using a fluorine-based gas or fluorocarbon-based gas.

5. The manufacturing method of claim 4, wherein a fluorocarbon-based polymer layer is formed on a sidewall of the first contact hole in the second etching, and
   the manufacturing method further comprises removing the polymer layer and the photosensitive film pattern by ashing.

6. The manufacturing method of claim 5, wherein the sidewall of the first contact hole is linearly formed in the driver semiconductor and the gate insulating layer such that an angle formed between the sidewall of the first contact hole and the substrate is in a range of 75 to 90°.

7. The manufacturing method of claim 4, wherein the gas used in the second etching further includes argon (Ar) or hydrogen ($H_2$).

8. The manufacturing method of claim 1, wherein the data line, the source electrode, the drain electrode, and the second connection member are formed together by using the same material.

9. The manufacturing method of claim 8, wherein the first contact hole through which the second connection member is exposed is formed in the passivation layer, and
   the manufacturing method further includes forming a contact assistant connected to the second connection member through the first contact hole, wherein
   the contact assistant is made of the same material as that of the pixel electrode.

* * * * *